(12) United States Patent
Kao

(10) Patent No.: US 9,350,373 B1
(45) Date of Patent: May 24, 2016

(54) ANALOG-TO-DIGITAL CONVERTER AND LONG-TERM-EVOLUTION ADVANCED DEVICE AND METHOD FOR ANALOG-TO-DIGITAL CONVERSION

(71) Applicant: MediaTek Inc., Hsin-Chu (TW)

(72) Inventor: Tsung-Kai Kao, Jhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/741,841

(22) Filed: Jun. 17, 2015

Related U.S. Application Data

(60) Provisional application No. 62/092,921, filed on Dec. 17, 2014.

(51) Int. Cl.
*H03M 3/00* (2006.01)
*H03M 1/08* (2006.01)
*H03M 1/12* (2006.01)

(52) U.S. Cl.
CPC .............. *H03M 1/0854* (2013.01); *H03M 1/12* (2013.01); *H03M 3/352* (2013.01); *H03M 3/458* (2013.01)

(58) Field of Classification Search
CPC ..... H03M 1/0854; H03M 3/458; H03M 1/12; H03M 3/352; H03M 7/3022
USPC ............................... 341/76–77, 118, 143, 155
See application file for complete search history.

(56) References Cited

U.S. PATENT DOCUMENTS

| | | | | |
|---|---|---|---|---|
| 5,153,593 A | * | 10/1992 | Walden | H03M 3/354 341/143 |
| 5,196,852 A | * | 3/1993 | Galton | H03M 3/468 341/143 |
| 5,363,101 A | * | 11/1994 | Ueki | H03M 3/35 341/143 |
| 5,416,483 A | * | 5/1995 | Matsuya | H03M 3/418 341/143 |
| 6,577,259 B1 | * | 6/2003 | Jelonnek | H03M 7/3022 341/143 |
| 6,683,550 B2 | * | 1/2004 | Al-Awadhi | H03M 1/20 341/143 |
| 6,930,625 B1 | | 8/2005 | Lin | |
| 7,460,046 B2 | * | 12/2008 | Di Giandomenico | H03M 7/3022 341/143 |
| 8,203,475 B2 | | 6/2012 | Hossain et al. | |
| 8,228,221 B2 | * | 7/2012 | Lai | H03M 3/38 341/118 |
| 8,421,660 B1 | * | 4/2013 | Wan | H03M 3/392 341/118 |
| 8,466,822 B2 | * | 6/2013 | Niwa | H03M 1/0678 341/118 |

* cited by examiner

*Primary Examiner* — Khai M Nguyen
(74) *Attorney, Agent, or Firm* — McClure, Qualey & Rodack, LLP

(57) ABSTRACT

An analog-to-digital conversion that converts an input signal to an output signal by using multiple analog-to-digital converting circuits. A first analog-to-digital converting circuit generates a first signal based on the input signal and further outputs a feature signal of a first quantization error of the first analog-to-digital converting circuit. A second analog-to-digital converting circuit generates a second signal based on the input signal and the feature signal. The output combiner combines the first signal and the second signal to generate the output signal and thereby to reduce a quantization error factor in the output signal that is due to the first quantization error.

20 Claims, 6 Drawing Sheets

ANALOG-TO-DIGITAL CONVERTER AND LONG-TERM-EVOLUTION ADVANCED DEVICE AND METHOD FOR ANALOG-TO-DIGITAL CONVERSION

CROSS REFERENCE TO RELATED APPLICATIONS

This application claims the benefit of U.S. Provisional Application No. 62/092,921, filed on Dec. 17, 2014, the entirety of which is incorporated by reference herein.

BACKGROUND OF THE INVENTION

1. Field of the Invention

The present invention relates to analog-to-digital conversion, particularly analog-to-digital conversion.

2. Description of the Related Art

In LTE-A (long-term-evolution advanced) systems, a signal may be transmitted in a contiguous channel or in non-contiguous channels. An analog-to-digital conversion device compatible with both contiguous channel and non-contiguous channel systems is called for.

BRIEF SUMMARY OF THE INVENTION

A analog-to-digital converter, a long-term-evolution advanced device and a method for analog-to-digital conversion are shown.

A analog-to-digital converter converting an input signal to an output signal in accordance with an exemplary embodiment of the disclosure comprises a first analog-to-digital converting circuit, a second analog-to-digital converting circuit and an output combiner. The first analog-to-digital converting circuit generates a first signal based on the input signal and further outputs a feature signal of a first quantization error of the first analog-to-digital converting circuit. The second analog-to-digital converting circuit generates a second signal based on the input signal and the feature signal. The output combiner combines the first signal and the second signal to generate the output signal and thereby to reduce a quantization error factor in the output signal that is due to the first quantization error.

The first analog-to-digital converting circuit may take feedback of the first signal into consideration and further comprises a first quantizer which generates the first signal that is blended with the first quantization error. The feature signal is extracted from the input side of the first quantizer. Furthermore, the second analog-to-digital converting circuit may take feedback of the second signal into consideration and comprises a second quantizer which generates the second signal that is blended with a second quantization error of the second analog-to-digital converting circuit. The feature signal is fed to the input side of the second quantizer.

A long-term-evolution advanced device in accordance with an exemplary embodiment of the disclosure comprises the aforementioned analog-to-digital converter for capturing a contiguous channel. When being used in capturing non-contiguous channels, the first analog-to-digital converting circuit and the second analog-to-digital converting circuit used in the aforementioned analog-to-digital converter are used separately, each corresponding to one signal channel band.

In another exemplary embodiment, a method for analog-to-digital conversion is introduced, which converts an input signal to an output signal and comprises the following steps: using a first analog-to-digital converting circuit to generate a first signal based on the input signal and further output a feature signal of a first quantization error of the first analog-to-digital converting circuit; using a second analog-to-digital converting circuit to generate a second signal based on the input signal and the feature signal; and combining the first signal and the second signal to generate the output signal and thereby to reduce a quantization error factor in the output signal that is due to the first quantization error.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1A:
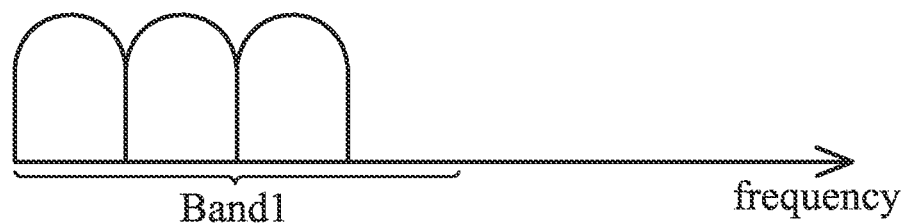
FIG. 1A illustrates a contiguous intra-band channel.
Figure 1B:
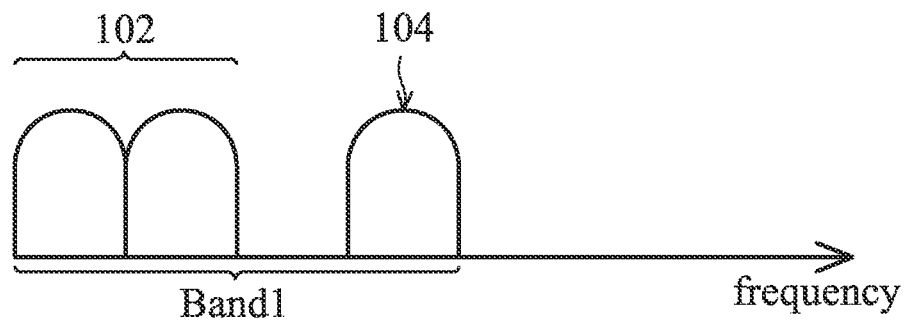
FIG. 1B illustrates non-contiguous intra-band channels.
Figure 1C:
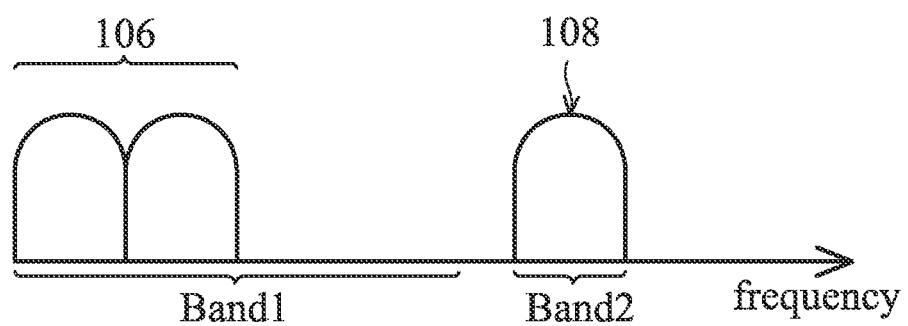
FIG. 1C illustrates non-contiguous inter-band channels.

In LTE-A (long-term-evolution advanced) systems, the signal may be transmitted in a contiguous channel or non-contiguous channels. FIG. 1A illustrates a contiguous intra-band channel within a frequency band Band1. FIG. 1B illustrates non-contiguous intra-band channels within the frequency band Band1. FIG. 1C illustrates non-contiguous inter-band channels cover two separate frequency bands Band1 and Band2. The capture of non-contiguous channels like the non-contiguous intra-band channel of FIG. 1B and the non-contiguous inter-band channel of FIG. 1C may require two individual analog-to-digital converting circuits. One for the signals in the lower frequency channel (102 or 106) and one for the signals in the higher frequency channel (104 or 108). As for capturing the signals in a contiguous channel like the contiguous intra-band channel of FIG. 1A, the two analog-to-digital converting circuits for capturing the non-contiguous channels of FIG. 1B or 1C are coupled together to form an analog-to-digital converter. For example, two individual analog-to-digital converting circuits each with 20 MHz bandwidth may be combined together to form an analog-to-digital converter with 40 MHz bandwidth (e.g. a broadband ADC).

Figure 2:
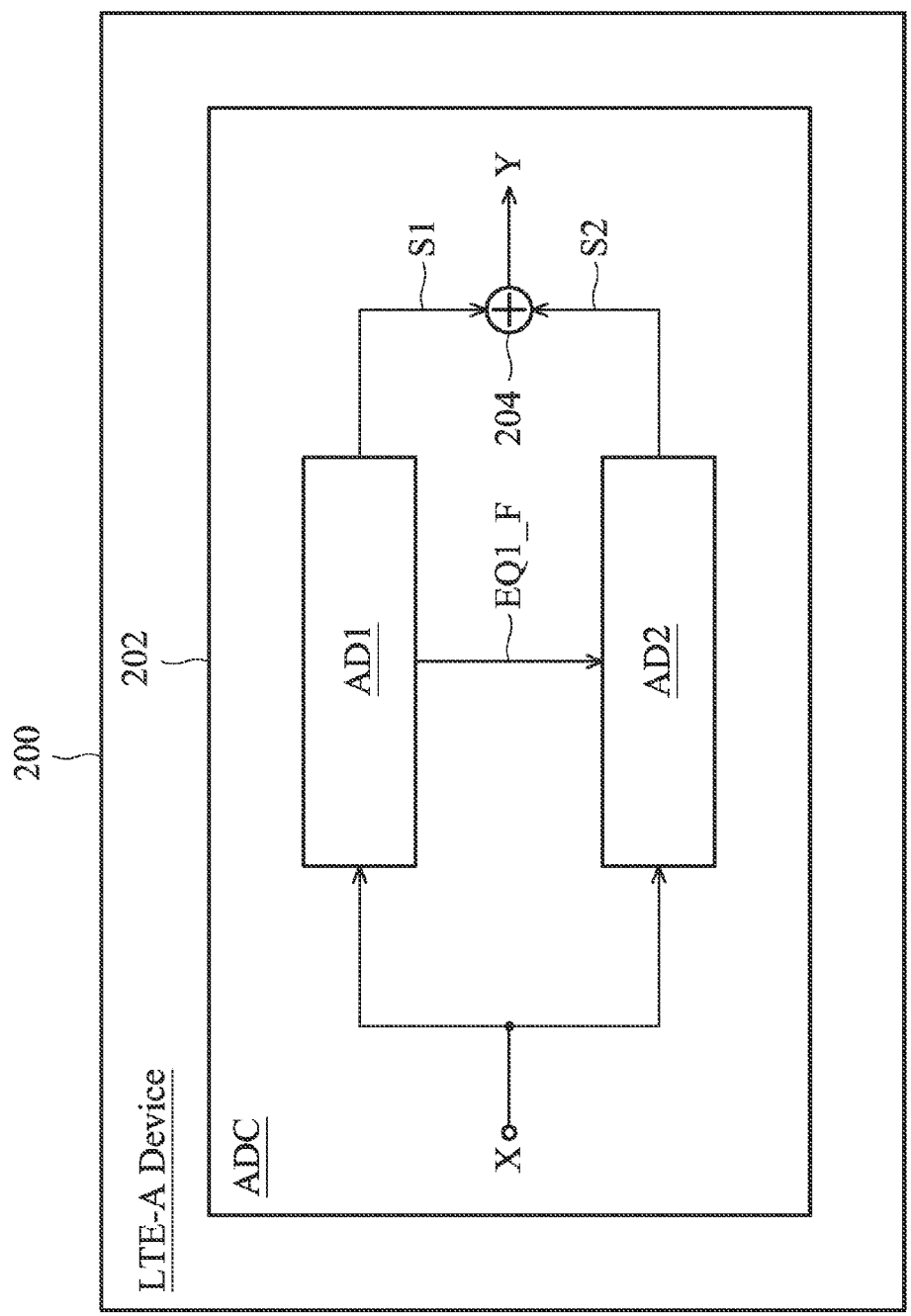
FIG. 2 is a block diagram showing an LTE-A (long-term-evolution advanced) device 200 using an analog-to-digital converter 202 in accordance with an exemplary embodiment of the disclosure.

FIG. 2 is a block diagram showing an LTE-A device 200 using an analog-to-digital converter 202 in accordance with an exemplary embodiment of the disclosure. The LET-A device 200 may be a cell phone.

The analog-to-digital converter 202 converts an input signal X to an output signal Y and comprises analog-to-digital converting circuits AD1 and AD2 and an output combiner 204. The analog-to-digital converting circuit AD1 generates signal S1 based on the input signal X and further outputs a feature signal EQ1_F of a quantization error of the analog-to-digital converting circuit AD1. The analog-to-digital converting circuit AD2 generates signal S2 based on the input signal X and the feature signal EQ1_F. The output combiner 204 combines the signals S1 and S2 to generate the output signal Y and thereby to reduce a quantization error factor in the output signal Y that is due to the quantization error of the analog-to-digital converting circuit AD1.

Figure 3A:
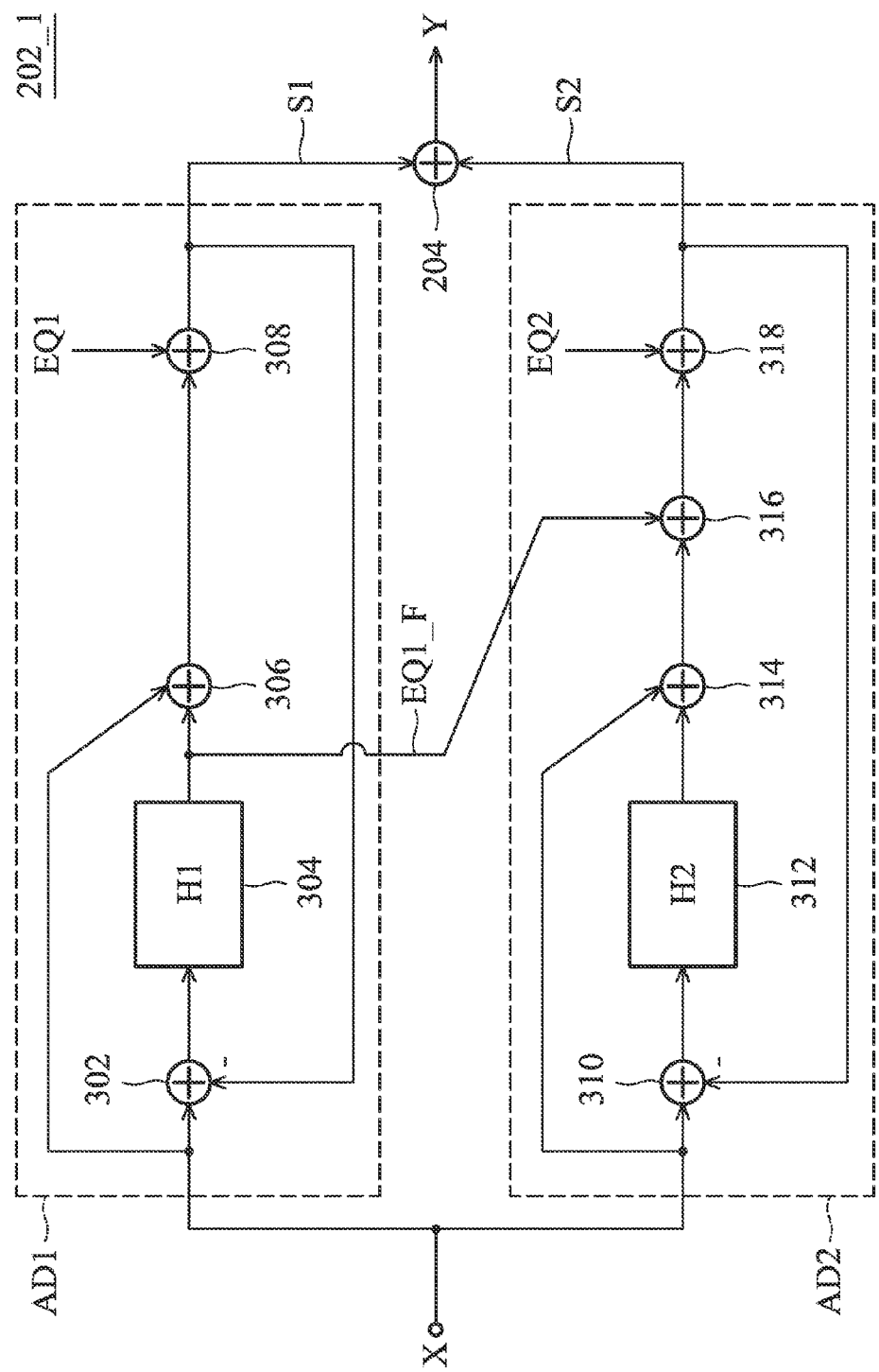
FIG. 3A depicts an analog-to-digital converter 202_1 in accordance with an exemplary embodiment of the disclosure.

FIG. 3A depicts an analog-to-digital converter 202_1 in accordance with an exemplary embodiment of the disclosure.

The analog-to-digital converting circuit AD1 comprises a feedback combiner 302, a filter 304, an input-feedforward combiner 306 and a quantizer 308. The feedback combiner 302 subtracts the signal S1 from the input signal X. The filter 304 filters an output of the feedback combiner 302. The input-feedforward combiner 306 combines the input signal X and an output of the filter 304. The quantizer 308 receives an output of the input-feedforward combiner 306 to generate the signal S1. As shown, by the quantizer 308, a quantization error EQ1 is blended into the signal S1. The signal S1 generated by the analog-to-digital converting circuit AD1 is:

$S1 = X + EQ1 \cdot 1/1 + H1$,

Note that the output of the filter 304 is coupled to the analog-to-digital converting circuit AD2 as the feature signal EQ1_F. The analog-to-digital converting circuit AD2 comprises a feedback combiner 310, a filter 312, an input-feedforward combiner 314, an error feature combiner 316 and a quantizer 318. The feedback combiner 310 subtracts the signal S2 from the input signal X. The filter 312 filters an output of the feedback combiner 310. The input-feedforward combiner 314 combines the input signal X and an output of the filter 312. The error feature combiner 316 combines the feature signal EQ1_F and an output of the input-feedforward combiner 314. The quantizer 318 receives an output of the error feature combiner 316 to generate the signal S2. As shown, by the quantizer 318, a quantization error EQ2 is blended into the signal S2. The signal S2 generated by the analog-to-digital converting circuit AD2 is:

$$S2 = X + EQ2 \cdot \frac{1}{1+H2} - EQ1 \cdot \frac{H1}{1+H1} \cdot \frac{1}{1+H2},$$

Signals S1 and S2 are combined together by the output combiner 204 to form the output signal Y, and thereby a quantization error factor due to the quantization error EQ1 is reduced in the output signal Y. The output signal Y is S1 plus S2 and may be represented as the following equation:

$$Y = 2X + EQ1 \cdot \frac{1}{1+H1} - EQ1 \cdot \frac{H1}{1+H1} \cdot \frac{1}{1+H2} + EQ2 \cdot \frac{1}{1+H2}.$$

In an exemplary embodiment with a low over sampling ratio and H1=H2, the quantization error factor due to the quantization error EQ1 is completely eliminated within desired bandwidth and Y is:

$Y = 2X + EQ2 \cdot 1/1 + H2$.

Figure 3B:
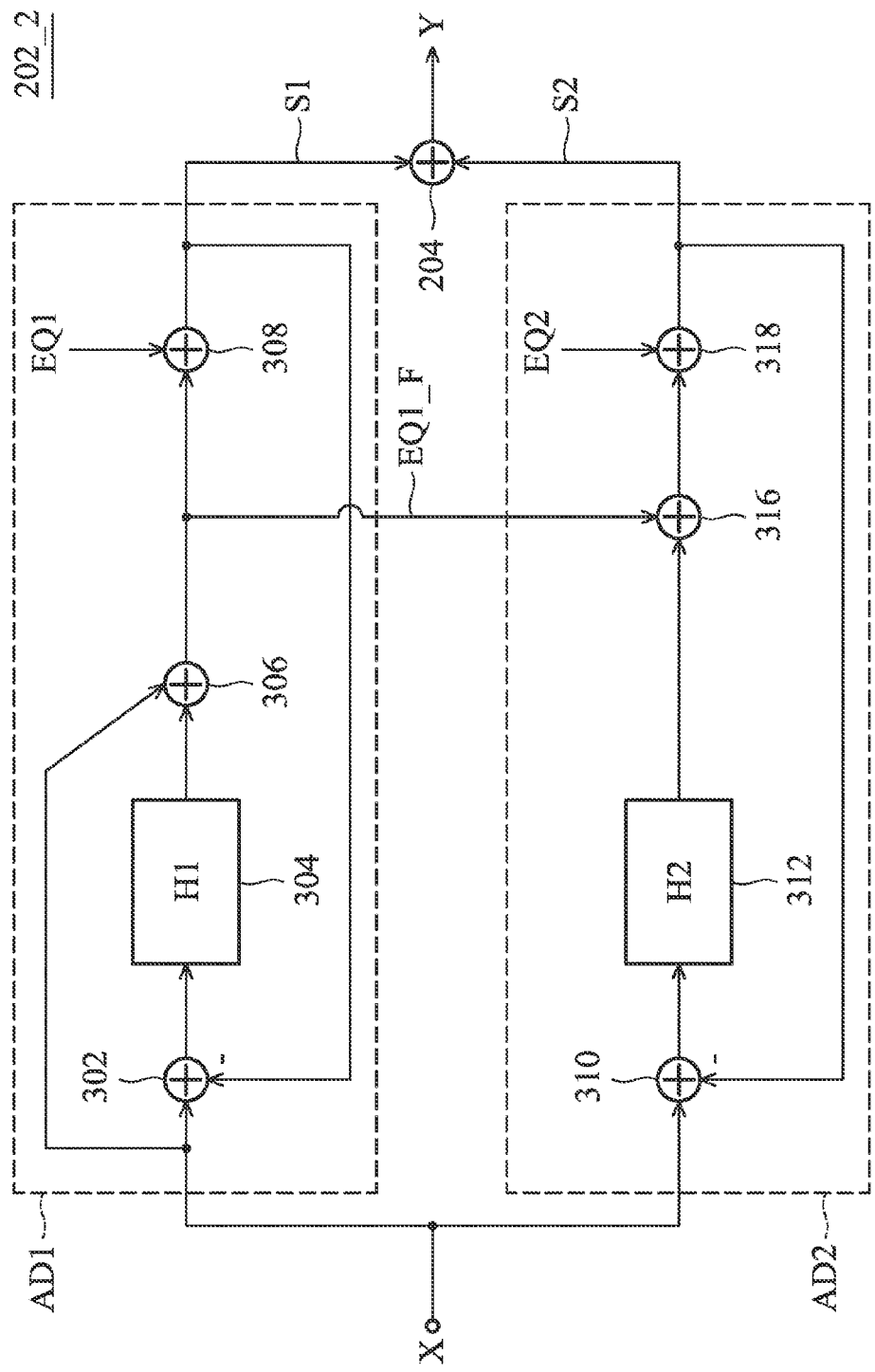
FIG. 3B depicts an analog-to-digital converter 202_2 in accordance with another exemplary embodiment of the disclosure.

FIG. 3B depicts an analog-to-digital converter 202_2 in accordance with another exemplary embodiment of the disclosure. In FIG. 3B, the analog-to-digital converting circuit AD2 does not include the input-feedforward combiner 314 shown in FIG. 3A and the feature signal EQ1_F is extracted from the output of the input-feedforward combiner 306 rather than from the output of the filter 304. The error feature combiner 316 combines the feature signal EQ1_F and an output of the filter 312. The transfer function of the analog-to-digital converter 202_2 is the same as the transfer function of the analog-to-digital converter 202_1. The quantization error factor due to the quantization error EQ1 is also completely eliminated within desired bandwidth in the structure of FIG. 3B when H1=H2 is at a low frequency.

In summary, the feature signal EQ1_F of the quantization error EQ1 of the analog-to-digital converting circuit AD1 may be extracted from any terminal at the input side of the quantizer 308. As shown in FIG. 3A, the output of the filter 304 that is at the input side of the quantizer 308 is coupled to the analog-to-digital converting circuit AD2 as the feature signal EQ1_F of the quantization error EQ1 of the analog-to-digital converting circuit AD1. As shown in FIG. 3B, the output of the input-feedforward combiner 306 that is at the input side of the quantizer 308 is coupled to the analog-to-digital converting circuit AD2 as the feature signal EQ1_F of the quantization error EQ1 of the analog-to-digital converting circuit AD1. Furthermore, the feature signal EQ1_F of the quantization error EQ1 of the analog-to-digital converting circuit AD1 may be fed into any terminal at the input side of the quantizer 318. As shown in FIG. 3A and FIG. 3B, the feature signal EQ1_F of the quantization error EQ1 of the analog-to-digital converting circuit AD1 is fed to the input side of the quantizer 318 by the error feature combiner 316. The analog-to-digital converting circuits AD1 and AD2 may be implemented by other AD design. The analog-to-digital converting circuits AD1 and AD2 are separated (e.g., by receiving different input signals, disconnecting from the output combiner 204 and without feeding the feature signal EQ1_F to the analog-to-digital converting circuit AD2) when being used in capturing non-contiguous channels.

Furthermore, the invention is not limited to using just two analog-to-digital converting circuits to form an analog-to-digital converter, and the reduction of quantization error may be performed on more than just one analog-to-digital converting circuit with the analog-to-digital converter.

Figure 4:
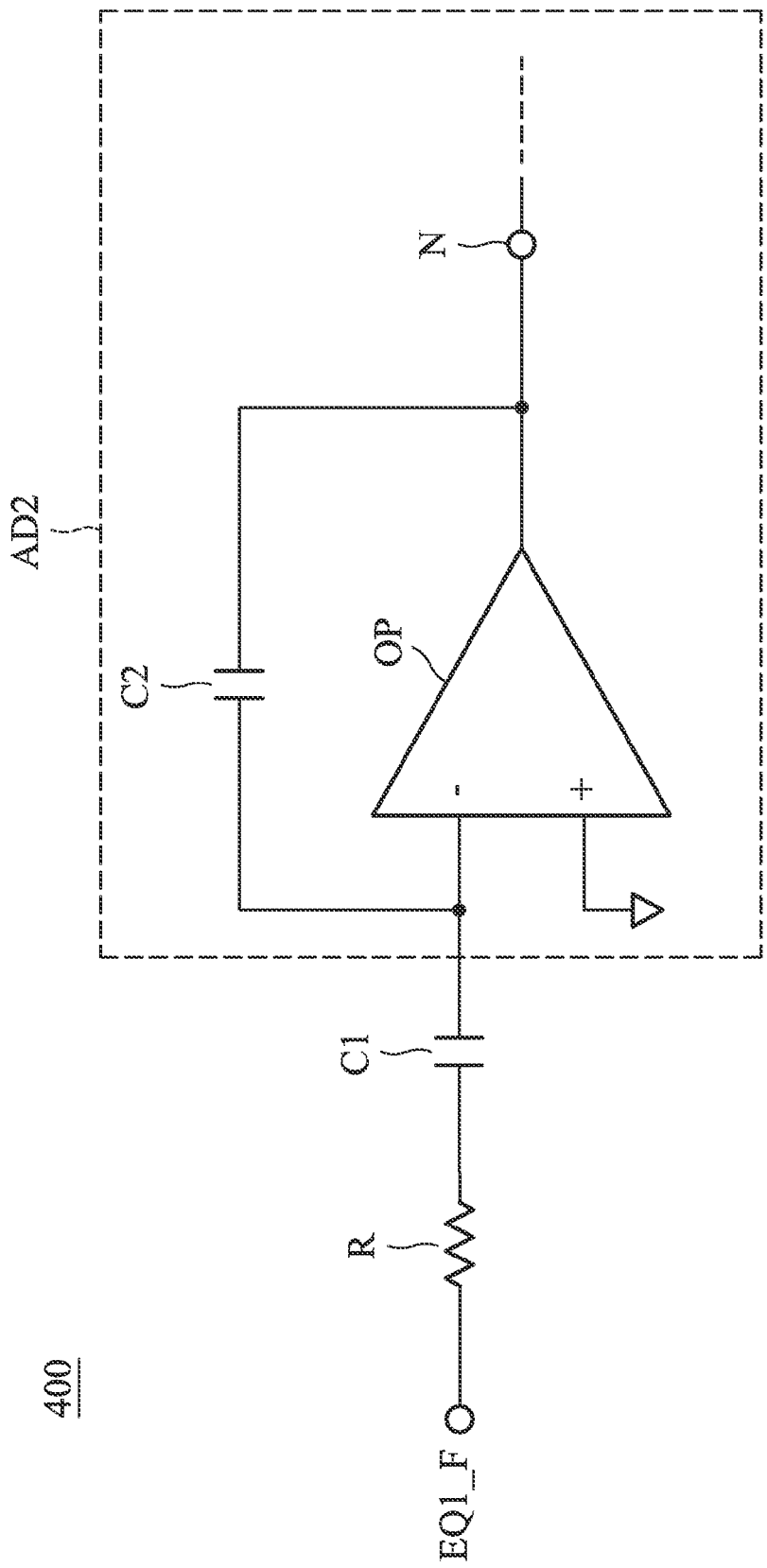
FIG. 4 illustrates a noise peak attenuation circuit 400 for the quantization error EQ1 in accordance with an exemplary embodiment of the disclosure.

FIG. 4 illustrates a noise peak attenuation circuit 400 for the quantization error EQ1 in accordance with an exemplary embodiment of the disclosure. A resistor R and a capacitor C1 are connected in series to couple the feature signal EQ1_F to the analog-to-digital converting circuit AD2. The resistor R and capacitor C1 form the noise peak attenuation circuit 400 with an operational amplifier OP and a feedback capacitor C2 of the operational amplifier OP. The analog-to-digital converting circuit AD2 may comprise a sigma delta modulator (SDM). The operational amplifier OP is one of a series of operational amplifiers within the sigma delta modulator.

The transfer function of the noise peak attenuation circuit 400 is:

$N/EQ1\_F = -C1/C2 \cdot 1/1 + sRC1$

The noise peak attenuation circuit 400 is a low pass filter that attenuates the out-band peaking of the quantization error EQ1.

Figure 5:
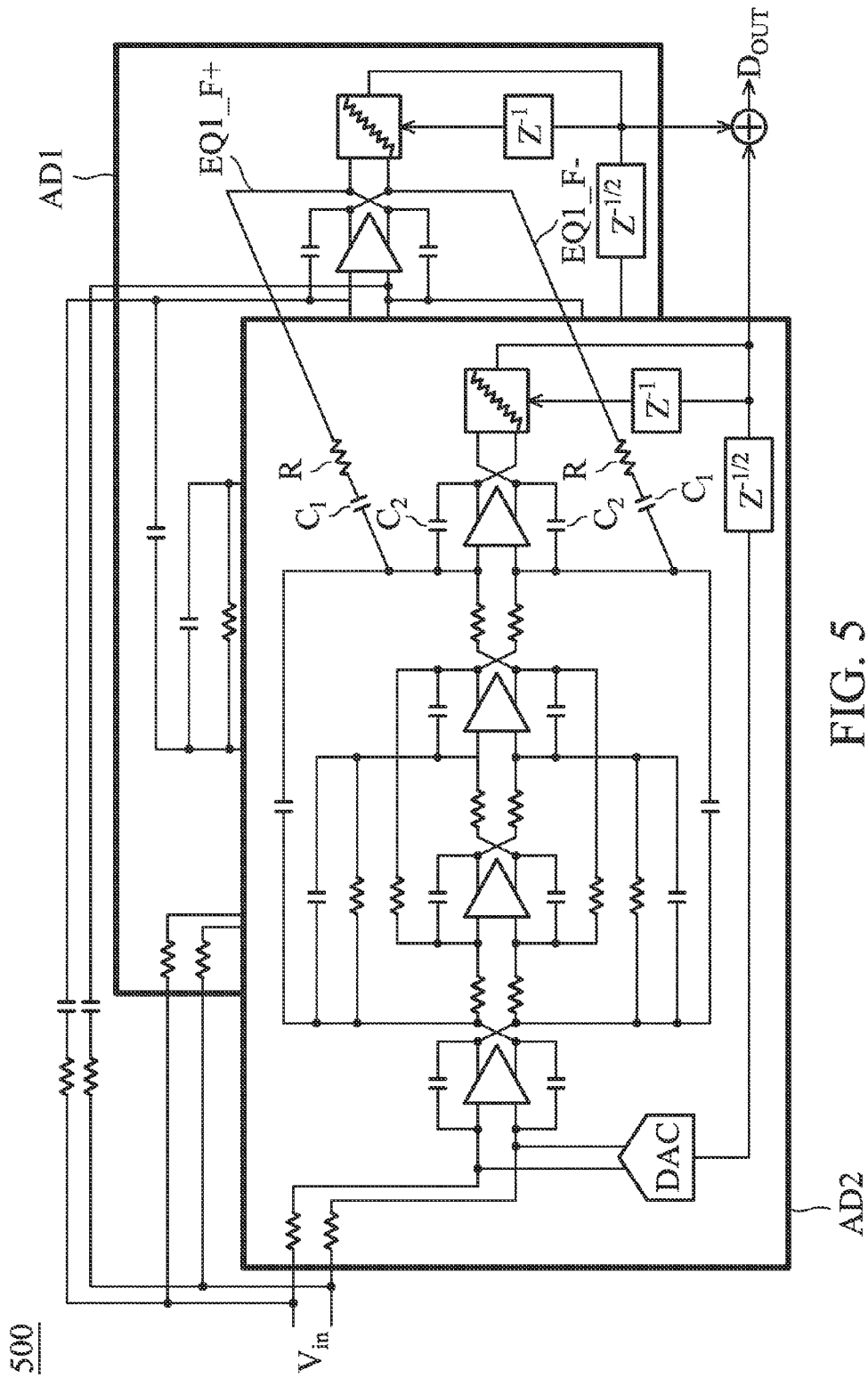
FIG. 5 depicts an analog-to-digital converter 500 with the peak noise attenuation design of FIG. 4.

FIG. 5 depicts an analog-to-digital converter 500 with the peak noise attenuation design of FIG. 4. In FIG. 5, the analog-to-digital converting circuits AD1 and AD2 are implemented by sigma-delta modulators (SDMs) that are in a differential architecture, and each contains a series of operational amplifiers. The feature signal EQ1_F between the differential terminals EQ1_F+ and EQ1_F− is coupled to the fourth operational amplifier OP of the analog-to-digital converting circuit AD2 by the resistors R and the capacitors C1 in the positive and negative signal paths. The out-band peaking of the quantization error EQ1 of the analog-to-digital converting circuit AD1 is effectively attenuated.

In another exemplary embodiment, a method for analog-to-digital conversion is introduced. With respect to FIG. 2, the analog-to-digital conversion method converts an input signal X to an output signal Y and comprises the following steps: using an analog-to-digital converting circuit AD1 to generate a signal S1 based on the input signal X and further output a feature signal EQ1_F of a quantization error of the analog-to-digital converting circuit AD1; using a analog-to-digital converting circuit AD2 to generate a signal S2 based on the input signal X and the feature signal EQ1_F; and combining the signal S1 and the signal S2 to generate the output signal Y and thereby to reduce a quantization error factor in the output signal Y that is due to the quantization error EQ1 of the analog-to-digital converting circuit AD1.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter, converting an input signal to an output signal, comprising:
    a first analog-to-digital converting circuit, generating a first signal based on the input signal and further outputting a feature signal of a first quantization error of the first analog-to-digital converting circuit;
    a second analog-to-digital converting circuit, generating a second signal based on the input signal and the feature signal; and
    an output combiner, combining the first signal and the second signal to generate the output signal and thereby to reduce a quantization error factor in the output signal that is due to the first quantization error.

2. The analog-to-digital converter as claimed in claim 1, wherein:
    the first analog-to-digital converting circuit includes a feedback control loop for a feedback of the first signal;
    the first analog-to-digital converting circuit comprises a first quantizer which generates the first signal that is blended with the first quantization error; and
    the feature signal is extracted from an input side of the first quantizer.

3. The analog-to-digital converter as claimed in claim 2, wherein:
    the second analog-to-digital converting circuit includes a feedback control loop for a feedback of the second signal;
    the second analog-to-digital converting circuit comprises a second quantizer which generates the second signal that is blended with a second quantization error of the second analog-to-digital converting circuit; and
    the feature signal is fed to an input side of the second quantizer.

4. The analog-to-digital converter as claimed in claim 1, wherein the first analog-to-digital converting circuit further comprises:
    a first feedback combiner, subtracting the first signal from the input signal;
    a first filter, filtering an output of the first feedback combiner;
    a first input-feedforward combiner, combining the input signal and an output of the first filter; and
    a first quantizer, receiving an output of the first input-feedforward combiner to generate the first signal that is blended with the first quantization error.

5. The analog-to-digital converter as claimed in claim 4, wherein:
    the output of the first filter is coupled to the second analog-to-digital converting circuit as the feature signal; and
    the second analog-to-digital converting circuit further comprises:
    a second feedback combiner, subtracting the second signal from the input signal;
    a second filter, filtering an output of the second feedback combiner;
    a second input-feedforward combiner, combining the input signal and an output of the second filter;
    an error feature combiner, combining the feature signal and an output of the second input-feedforward combiner; and
    a second quantizer, receiving an output of the error feature combiner to generate the second signal that is blended with a second quantization error of the second analog-to-digital converting circuit.

6. The analog-to-digital converter as claimed in claim 5, wherein:
    the first filter provides a first transfer function that is the same as a second transfer function of the second filter.

7. The analog-to-digital converter as claimed in claim 4, wherein:
    the output of the first input-feedforward combiner is coupled to the second analog-to-digital converting circuit as the feature signal; and
    the second analog-to-digital converting circuit further comprises:
    a second feedback combiner, subtracting the second signal from the input signal;
    a second filter, filtering an output of the second feedback combiner;
    an error feature combiner, combining the feature signal and an output of the second filter; and
    a second quantizer, receiving an output of the error feature combiner to generate the second signal that is blended with a second quantization error of the second analog-to-digital converting circuit.

8. The analog-to-digital converter as claimed in claim 7, wherein:
    the first filter provides a first transfer function that is the same as a second transfer function of the second filter.

9. The analog-to-digital converter as claimed in claim 1, further comprising:
    a resistor and a capacitor, connected in series to couple the feature signal to the second analog-to-digital converting circuit,
    wherein the resistor and capacitor form a noise peak attenuation circuit for the first quantization error with an operational amplifier within the second analog-to-digital converting circuit and a feedback capacitor of the operational amplifier.

10. The analog-to-digital converter as claimed in claim 9, wherein:
the second analog-to-digital converting circuit comprises a sigma delta modulator; and
the operational amplifier is one of a series of operational amplifiers within the sigma delta modulator.

11. A long-term-evolution advanced device, comprising:
the analog-to-digital converter as claimed in claim 1 for capturing a contiguous channel,
wherein the first analog-to-digital converting circuit and the second analog-to-digital converting circuit are separated when being used in capturing non-contiguous channels.

12. A method for analog-to-digital conversion converting an input signal to an output signal, comprising:
using a first analog-to-digital converting circuit to generate a first signal based on the input signal and further output a feature signal of a first quantization error of the first analog-to-digital converting circuit;
using a second analog-to-digital converting circuit to generate a second signal based on the input signal and the feature signal; and
combining the first signal and the second signal to generate the output signal and thereby to reduce a quantization error factor in the output signal that is due to the first quantization error.

13. The method as claimed in claim 12, wherein:
the first analog-to-digital converting circuit includes a feedback control loop for a feedback of the first signal;
the first analog-to-digital converting circuit comprises a first quantizer which generates the first signal that is blended with the first quantization error; and
the feature signal is extracted from an input side of the first quantizer.

14. The method as claimed in claim 13, wherein:
the second analog-to-digital converting circuit includes a feedback control loop for a feedback of the second signal;
the second analog-to-digital converting circuit comprises a second quantizer which generates the second signal that is blended with a second quantization error of the second analog-to-digital converting circuit; and
the feature signal is fed to an input side of the second quantizer.

15. The method as claimed in claim 12, wherein the first analog-to-digital converting circuit further comprises:
a first feedback combiner, subtracting the first signal from the input signal;
a first filter, filtering an output of the first feedback combiner;
a first input-feedforward combiner, combining the input signal and an output of the first filter; and
a first quantizer, receiving an output of the first input-feedforward combiner to generate the first signal that is blended with the first quantization error.

16. The method as claimed in claim 15, wherein:
the output of the first filter is coupled to the second analog-to-digital converting circuit as the feature signal; and
the second analog-to-digital converting circuit further comprises:
a second feedback combiner, subtracting the second signal from the input signal;
a second filter, filtering an output of the second feedback combiner;
a second input-feedforward combiner, combining the input signal and an output of the second filter;
an error feature combiner, combining the feature signal and an output of the second input-feedforward combiner; and
a second quantizer, receiving an output of the error feature combiner to generate the second signal that is blended with a second quantization error of the second analog-to-digital converting circuit.

17. The method as claimed in claim 16, wherein:
the first filter provides a first transfer function that is the same as a second transfer function of the second filter.

18. The method as claimed in claim 15, wherein:
the output of the first input-feedforward combiner is coupled to the second analog-to-digital converting circuit as the feature signal; and
the second analog-to-digital converting circuit further comprises:
a second feedback combiner, subtracting the second signal from the input signal;
a second filter, filtering an output of the second feedback combiner;
an error feature combiner, combining the feature signal and an output of the second filter; and
a second quantizer, receiving an output of the error feature combiner to generate the second signal that is blended with a second quantization error of the second analog-to-digital converting circuit.

19. The method as claimed in claim 18, wherein:
the first filter provides a first transfer function that is the same as a second transfer function of the second filter.

20. The method as claimed in claim 12, further comprising:
providing a resistor and a capacitor connected in series to couple the feature signal to the second analog-to-digital converting circuit,
wherein the resistor and capacitor form a noise peak attenuation circuit for the first quantization error with an operational amplifier within the second analog-to-digital converting circuit and a feedback capacitor of the operational amplifier.

* * * * *